(12) United States Patent
Kim et al.

(10) Patent No.: US 12,444,366 B2
(45) Date of Patent: Oct. 14, 2025

(54) DISPLAY APPARATUS

(71) Applicant: Samsung Display Co., Ltd., Yongin-Si (KR)

(72) Inventors: Dongwoo Kim, Yongin-si (KR); Sangjin Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/740,508

(22) Filed: Jun. 12, 2024

(65) Prior Publication Data

US 2025/0104627 A1   Mar. 27, 2025

(30) Foreign Application Priority Data

Sep. 27, 2023   (KR) .................. 10-2023-0131244

(51) Int. Cl.
*G09G 3/3233* (2016.01)

(52) U.S. Cl.
CPC ... *G09G 3/3233* (2013.01); *G09G 2300/0819* (2013.01); *G09G 2300/0852* (2013.01); *G09G 2320/0223* (2013.01)

(58) Field of Classification Search
CPC ......... G09G 3/3233; G09G 2300/0819; G09G 2300/0852; G09G 2320/0223
See application file for complete search history.

(56) References Cited

U.S. PATENT DOCUMENTS

| | | | |
|---|---|---|---|
| 9,343,484 B2 | 5/2016 | Park et al. | |
| 11,688,331 B2 | 6/2023 | Hwang et al. | |
| 11,837,156 B2 | 12/2023 | Hwang et al. | |
| 2015/0138258 A1* | 5/2015 | Lee | G09G 3/3225 345/691 |
| 2023/0121681 A1* | 4/2023 | Hwang | G09G 3/2014 345/55 |
| 2023/0186836 A1* | 6/2023 | Jeong | G09G 3/32 345/55 |

FOREIGN PATENT DOCUMENTS

| KR | 10-2016-0027332 A | 3/2016 |
|---|---|---|
| KR | 10-2498084 B1 | 2/2023 |
| KR | 10-2023-0053781 A | 4/2023 |
| KR | 10-2023-0056081 A | 4/2023 |

* cited by examiner

*Primary Examiner* — Stacy Khoo
(74) *Attorney, Agent, or Firm* — Innovation Counsel LLP

(57) ABSTRACT

A display apparatus includes a pixel including a first sub-pixel including a first pulse width modulator outputting a first gate output signal for pulse width modulation in response to a first pulse width data and controlling a first driving current of a first light emitting element and a first pulse amplitude modulator applying the first driving current to the first light emitting element in response to a first pulse amplitude data, a second sub-pixel including a second pulse width modulator outputting a second gate output signal for pulse width modulation in response to a second pulse width data and controlling a second driving current of a second light emitting element and a second pulse amplitude modulator applying the second driving current to the second light emitting element in response to a second pulse amplitude data and an initializer initializing the first gate output signal and the second gate output signal.

20 Claims, 10 Drawing Sheets

DISPLAY APPARATUS

CROSS-REFERENCE TO RELATED APPLICATION

This application claims priority under 35 USC § 119 to Korean Patent Application No. 10-2023-0131244 filed on Sep. 27, 2023 in the Korean Intellectual Property Office KIPO, the contents of which are herein incorporated by reference in their entireties.

BACKGROUND

1. Field

Embodiments of the present inventive concept relate to a display apparatus. More particularly, the present inventive concept relate to a display apparatus applied in various electronic apparatuses.

2. Description of the Related Art

Generally, a display apparatus includes a display panel and a display panel driver. The display panel includes a plurality of gate lines, a plurality of data lines, a plurality of emission lines and a plurality of pixels. The display panel driver may include a gate driver providing gate signals to the gate lines, a data driver providing data voltages to the data lines, an emission driver providing emission signals to the emission lines and a driving controller controlling the gate driver, the data driver and the emission driver. Additionally, the pixel may include sub-pixels.

Each of the sub-pixels may include multiple transistors and multiple capacitors. When each of the sub-pixels includes the multiple transistors and the multiple capacitors, the pixel may not be applied to an ultra-resolution display apparatus due to a limitation in integration.

SUMMARY

Embodiments of the present inventive concept may provide a display apparatus for improving integration and applicable to an ultra-resolution display apparatus by reducing the number of transistors and capacitors included in a pixel through sharing some functional circuits of sub-pixels.

In an embodiment of a display apparatus according to the present inventive concept, the display apparatus includes a display panel, a data driver, an emission driver, a gate driver and a driving controller. The display panel includes a pixel. The data driver provides data voltages to the pixel. The emission driver provides an emission signal to the pixel. The gate driver provides a gate signal to the pixel. The driving controller controls the data driver and the emission driver. The pixel includes a first sub-pixel including a first pulse width modulator configured to output a first gate output signal for a pulse width modulation in response to a first pulse width data voltage and configured to control a period of a first driving current applied to a first light emitting element and a first pulse amplitude modulator configured to apply the first driving current to the first light emitting element in response to a first pulse amplitude data voltage different from the first pulse width data voltage, a second sub-pixel including a second pulse width modulator configured to output a second gate output signal for the pulse width modulation in response to a second pulse width data voltage different from the first pulse width data voltage and configured to control a period of a second driving current applied to a second light emitting element and a second pulse amplitude modulator configured to apply the second driving current to the second light emitting element in response to a second pulse amplitude data voltage different from the second pulse width data voltage and an initializer configured to initialize the first gate output signal and the second gate output signal in response to a second initialization signal.

In an embodiment of the present inventive concept, the initializer may include a third transistor including a control electrode configured to receive the second initialization signal, a first electrode connected to a second node and a second electrode configured to receive an initialization voltage.

In an embodiment of the present inventive concept, the pixel may further include a voltage drop compensator configured to compensate a voltage drop of the first pulse amplitude modulator and a voltage drop of the second pulse amplitude modulator.

In an embodiment of the present inventive concept, the voltage drop compensator may include a first transistor including a control electrode configured to receive the second initialization signal, a first electrode configured to receive a first power voltage and a second electrode connected to a first node and a second transistor including a control electrode configured to receive a first emission signal, a first electrode connected to the first node and a second electrode configured to receive a second power voltage.

In an embodiment of the present inventive concept, the pixel may further include a light emitting element initializer configured to initialize the first light emitting element and the second light emitting element in response to the second initialization signal.

In an embodiment of the present inventive concept, the light emitting element initializer may include a fourth transistor including a control electrode configured to receive the second initialization signal, a first electrode connected to a third node and a second electrode configured to receive a third power voltage and a first capacitor including a first electrode connected to the third node and a second electrode configured to receive the third power voltage.

In an embodiment of the present inventive concept, the pixel may further include a voltage drop compensator configured to compensate a voltage drop of the first pulse amplitude modulator and a voltage drop of the second pulse amplitude modulator and a light emitting element initializer configured to initialize the first light emitting element and the second light emitting element in response to the second initialization signal.

In an embodiment of the present inventive concept, the voltage drop compensator may include first transistor including a control electrode configured to receive the second initialization signal, a first electrode configured to receive a first power voltage and a second electrode connected to a first node and a second transistor including a control electrode configured to receive a first emission signal, a first electrode connected to the first node and a second electrode configured to receive a second power voltage. The light emitting element initializer may include a fourth transistor including a control electrode configured to receive the second initialization signal, a first electrode connected to a third node and a second electrode configured to receive a third power voltage and a first capacitor including a first electrode connected to the third node and a second electrode configured to receive the third power voltage.

In an embodiment of the present inventive concept, the pixel may further include a third sub-pixel including a third pulse width modulator configured to output a third gate output signal for the pulse width modulation in response to a third pulse width data voltage different from the first pulse width data voltage and the second pulse width data voltage and configured to control a period of a third driving current applied to a third light emitting element and a third pulse amplitude modulator configured to apply the third driving current to the third light emitting element in response to a third pulse amplitude data voltage different from the third pulse width data voltage. The initializer may initialize the first gate output signal, the second gate output signal and the third gate output signal in response to the second initialization signal.

In an embodiment of the present inventive concept, the pixel may further include a voltage drop compensator configured to compensate a voltage drop of the first pulse amplitude modulator, a voltage drop of the second pulse amplitude modulator and a voltage drop of the third pulse amplitude modulator.

In an embodiment of the present inventive concept, the pixel may further include a light emitting element initializer configured to initialize the first light emitting element, the second light emitting element and the third light emitting element in response to the second initialization signal.

In an embodiment of the present inventive concept, the pixel may further include a voltage drop compensator configured to compensate a voltage drop of the first pulse amplitude modulator, a voltage drop of the second pulse amplitude modulator and a voltage drop of the third pulse amplitude modulator and a light emitting element initializer configured to initialize the first light emitting element, the second light emitting element and the third light emitting element in response to the second initialization signal.

In an embodiment of the present inventive concept, the voltage drop compensator may include a first transistor including a control electrode configured to receive the second initialization signal, a first electrode configured to receive a first power voltage and a second electrode connected to a first node and a second transistor including a control electrode configured to receive a first emission signal, a first electrode connected to the first node and a second electrode configured to receive a second power voltage. The light emitting element initializer may include a fourth transistor including a control electrode configured to receive the second initialization signal, a first electrode connected to a third node and a second electrode configured to receive a third power voltage and a first capacitor including a first electrode connected to the third node and a second electrode configured to receive the third power voltage.

In an embodiment of a display apparatus according to the present inventive concept, the display apparatus includes a display panel, a data driver, an emission driver, a gate driver and a driving controller. The display panel includes a pixel. The data driver provides data voltages to the pixel. The emission driver provides an emission signal to the pixel. The gate driver provides a gate signal to the pixel. The driving controller controls the data driver and the emission driver. The pixel includes a first sub-pixel including a first pulse width modulator configured to output a first gate output signal for a pulse width modulation in response to a first pulse width data voltage and configured to control a period of a first driving current applied to a first light emitting element, a first pulse amplitude modulator configured to apply the first driving current to the first light emitting element in response to a first pulse amplitude data voltage different from the first pulse width data voltage and a first initializer configured to initialize the first gate output signal in response to a second initialization signal, a second sub-pixel including a second pulse width modulator configured to output a second gate output signal for the pulse width modulation in response to a second pulse width data voltage different from the first pulse width data voltage and configured to control a period of a second driving current applied to a second light emitting element, a second pulse amplitude modulator configured to apply the second driving current to the second light emitting element in response to a second pulse amplitude data voltage different from the second pulse width data voltage and a second initializer configured to initialize the second gate output signal in response to the second initialization signal and a voltage drop compensator configured to compensate a voltage drop of the first pulse amplitude modulator and a voltage drop of the second pulse amplitude modulator.

In an embodiment of the present inventive concept, the pixel may further include a light emitting element initializer configured to initialize the first light emitting element and the second light emitting element in response to the second initialization signal.

In an embodiment of the present inventive concept, the pixel may further include a third sub-pixel including a third pulse width modulator configured to output a third gate output signal for the pulse width modulation in response to a third pulse width data voltage different from the first pulse width data voltage and the second pulse width data voltage and configured to control a period of a third driving current applied to a third light emitting element, a third pulse amplitude modulator configured to apply the third driving current to the third light emitting element in response to a third pulse amplitude data voltage different from the third pulse width data voltage and a third initializer configured to initialize the third gate output signal in response to the second initialization signal. The voltage drop compensator may compensate a voltage drop of the first pulse amplitude modulator, a voltage drop of the second pulse amplitude modulator and a voltage drop of the third pulse amplitude modulator.

In an embodiment of the present inventive concept, the pixel may further include a light emitting element initializer configured to initialize the first light emitting element, the second light emitting element and the third light emitting element in response to the second initialization signal.

In an embodiment of the present inventive concept, the voltage drop compensator may include a first transistor including a control electrode configured to receive the second initialization signal, a first electrode configured to receive a first power voltage and a second electrode connected to a first node and a second transistor including a control electrode configured to receive a first emission signal, a first electrode connected to the first node and a second electrode configured to receive a second power voltage. The light emitting element initializer may include a fourth transistor including a control electrode configured to receive the second initialization signal, a first electrode connected to a third node and a second electrode configured to receive a third power voltage and a first capacitor including a first electrode connected to the third node and a second electrode configured to receive the third power voltage.

In an embodiment of a display apparatus according to the present inventive concept, the display apparatus includes a display panel, a data driver, an emission driver, a gate driver and a driving controller. The display panel includes a pixel. The data driver provides data voltages to the pixel. The emission driver provides an emission signal to the pixel. The gate driver provides a gate signal to the pixel. The driving controller controls the data driver and the emission driver. The pixel includes a first sub-pixel including a first pulse width modulator configured to output a first gate output signal for a pulse width modulation in response to a first pulse width data voltage and configured to control a period of a first driving current applied to a first light emitting element, a first pulse amplitude modulator configured to apply the first driving current to the first light emitting element in response to a first pulse amplitude data voltage different from the first pulse width data voltage and a first initializer configured to initialize the first gate output signal in response to a second initialization signal, a second sub-pixel including a second pulse width modulator configured to output a second gate output signal for the pulse width modulation in response to a second pulse width data voltage different from the first pulse width data voltage and configured to control a period of a second driving current applied to a second light emitting element, a second pulse amplitude modulator configured to apply the second driving current to the second light emitting element in response to a second pulse amplitude data voltage different from the second pulse width data voltage and a second initializer configured to initialize the second gate output signal in response to the second initialization signal and a light emitting element initializer configured to initialize the first light emitting element and the second light emitting element in response to the second initialization signal.

In an embodiment of the present inventive concept, the pixel may further include a third sub-pixel including a third pulse width modulator configured to output a third gate output signal for the pulse width modulation in response to a third pulse width data voltage different from the first pulse width data voltage and the second pulse width data voltage and configured to control a period of a third driving current applied to a third light emitting element, a third pulse amplitude modulator configured to apply the third driving current to the third light emitting element in response to a third pulse amplitude data voltage different from the third pulse width data voltage and a third initializer configured to initialize the third gate output signal in response to the second initialization signal. The light emitting element initializer may initialize the first light emitting element, the second light emitting element and the third light emitting element.

According to the display apparatus described above, the pixel included in the display apparatus may include sub-pixels and the sub-pixels may share some functional circuits. Accordingly, the number of transistors and capacitors included in the pixel may be reduced compared to a conventional pixel. Accordingly, integration of the pixel may be improved and a yield of the pixel may be improved. Additionally, the pixel may be applicable to an ultra-high resolution display apparatus.

In addition, as the integration of the pixel is improved, a product including the display panel suitable for an ultra-high resolution and a low power consumption may be manufactured.

BRIEF DESCRIPTION OF THE DRAWINGS

The above and other features and advantages of the present inventive concept will become more apparent by describing in detailed embodiments thereof with reference to the accompanying drawings, in which.

DETAILED DESCRIPTION OF THE EMBODIMENTS

Hereinafter, the present inventive concept will be described in more detail with reference to the accompanying drawings.

Figure 1:
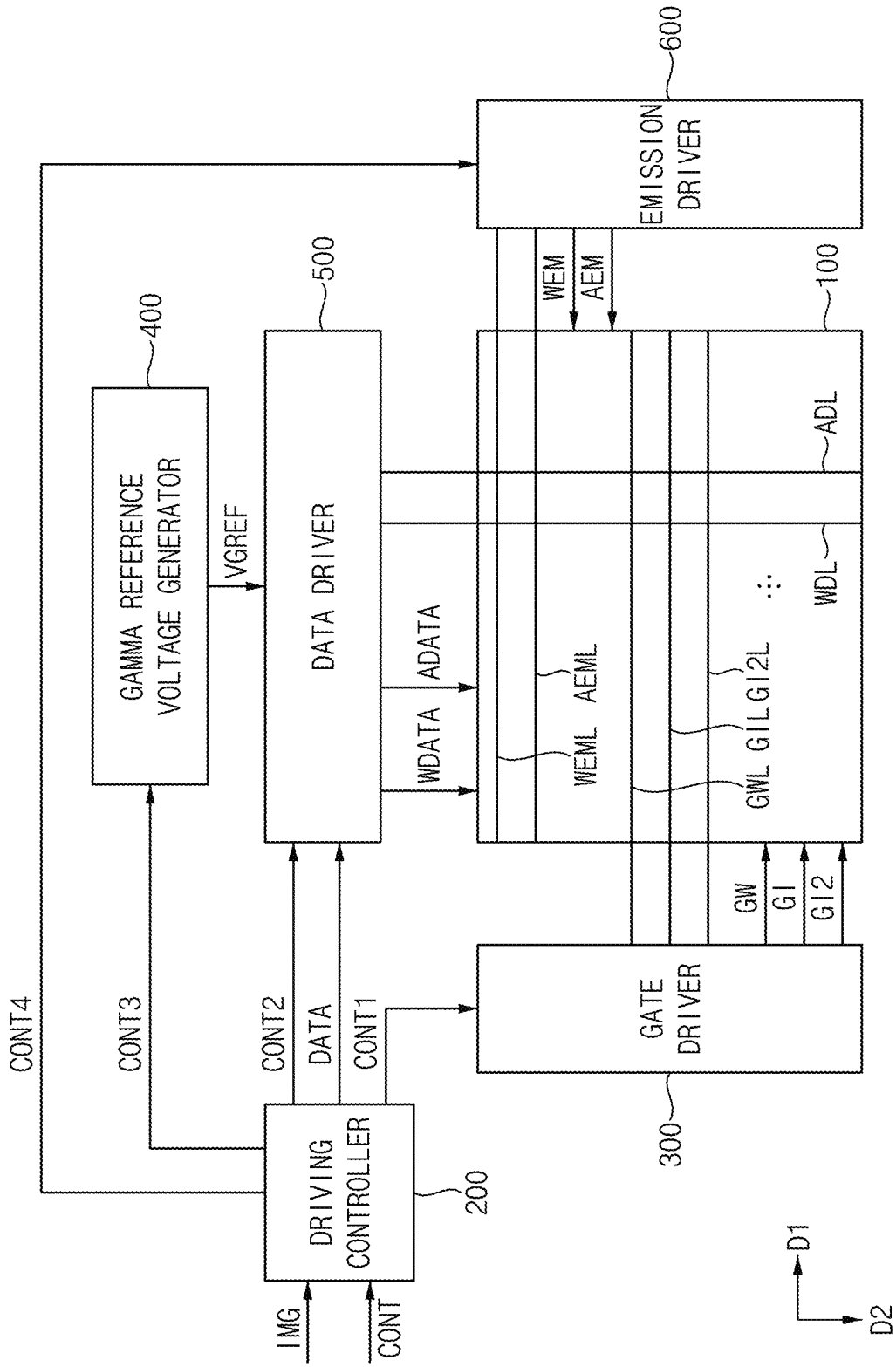
FIG. 1 is a block diagram illustrating a display apparatus according to an embodiment of the present inventive concept.
Figure 2:
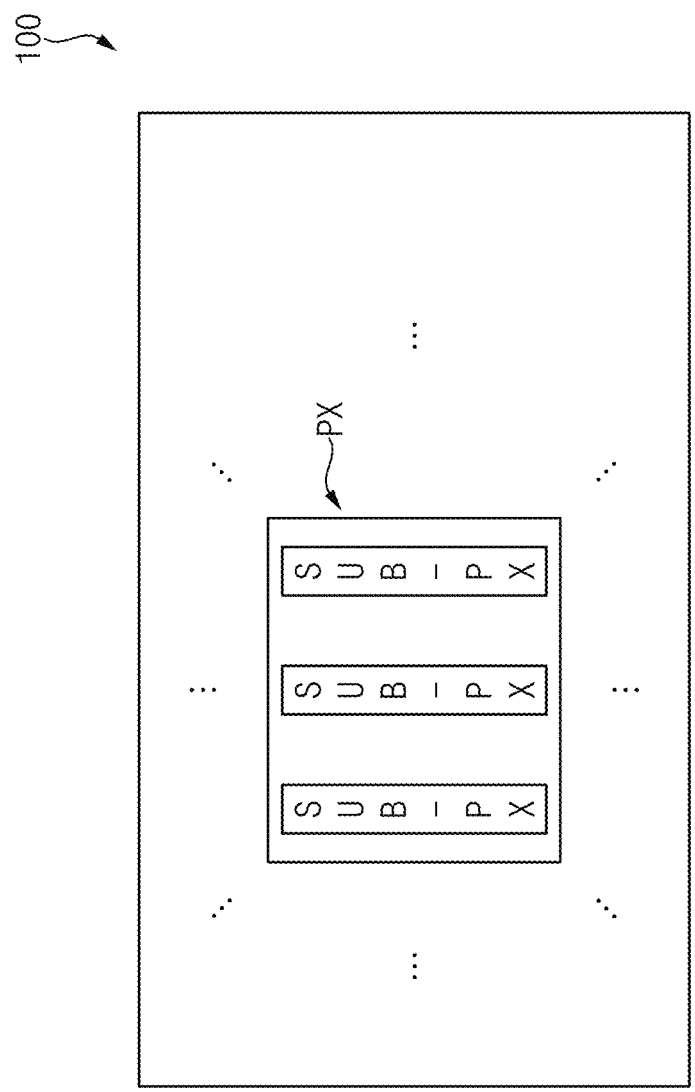
FIG. 2 is a block diagram illustrating a display panel of FIG. 1.

FIG. 1 is a block diagram illustrating a display apparatus according to an embodiment of the present inventive concept. FIG. 2 is a block diagram illustrating a display panel 100 of FIG. 1.

Referring to FIG. 1 and FIG. 2, the display apparatus includes a display panel 100 and a display panel driver. The display panel driver includes a driving controller 200, a gate driver 300, a gamma reference voltage generator 400, a data driver 500 and an emission driver 600.

The display panel 100 includes a display region configured to display an image and a peripheral region adjacent to the display region.

The display panel 100 includes a plurality of gate lines GWL, GIL and GI2L, a plurality of data lines WDL and ADL, a plurality of emission lines WEML and AEML and a plurality of pixels PX electrically connected to the gate lines GWL, GIL and GI2L, the data lines WDL and ADL and the emission lines WEML and AEML respectively. The gate lines GWL, GIL and GI2L may extend in a first direction D1, the data lines WDL and ADL may extend in a second direction D2 crossing the first direction D1 and the emission lines WEML and AEML may extend in the first direction D1.

The driving controller 200 receives input image data IMG and an input control signal CONT from an external device. For example, the input image data IMG may include red image data, green image data and blue image data. The input image data IMG may include white image data. The input image data IMG may include magenta image data, yellow image data and cyan image data. The input control signal CONT may include a master clock signal and a data enable signal. The input control signal CONT may further include a vertical synchronization signal and a horizontal synchronization signal.

The driving controller 200 generates a first control signal CONT1, a second control signal CONT2, a third control signal CONT3, a fourth control signal CONT4 and a data signal DATA based on the input image data IMG and the input control signal CONT.

The driving controller 200 generates the first control signal CONT1 for controlling an operation of the gate driver 300 based on the input control signal CONT and outputs the generated first control signal CONT1 to the gate driver 300. The first control signal CONT1 may include a vertical start signal and a gate clock signal.

The driving controller 200 generates the second control signal CONT2 for controlling an operation of the data driver 500 based on the input control signal CONT and outputs the generated second control signal CONT2 to the data driver 500. The second control signal CONT2 may include a horizontal start signal and a load signal.

The driving controller 200 generates the data signal DATA based on the input image data IMG. The driving controller 200 outputs the data signal DATA to the data driver 500.

The driving controller 200 generates the third control signal CONT3 for controlling an operation of the gamma reference voltage generator 400 based on the input control signal CONT and outputs the generated third control signal CONT3 to the gamma reference voltage generator 400.

The driving controller 200 generates the fourth control signal CONT4 for controlling an operation of the emission driver 600 based on the input control signal CONT and outputs the generated fourth control signal CONT4 to the emission driver 600.

The gate driver 300 generates gate signals GW, GI and GI2 for driving the gate lines GWL, GIL and GI2L in response to the first control signal CONT1 received from the driving controller 200. The gate driver 300 may output the gate signals to the gate lines GWL, GIL and GI2L. The gate signals GW, GI and GI2 may include a write signal GW, an initialization signal GI and a second initialization signal GI2.

In an embodiment of the present inventive concept, the gate driver 300 may be integrated on the peripheral region of the display panel 100. In an embodiment of the present inventive concept, the gate driver 300 may be mounted on the peripheral region of the display panel 100.

The gamma reference voltage generator 400 generates a gamma reference voltage VGREF in response to the third control signal CONT3 received from the driving controller 200. The gamma reference voltage generator 400 provides the gamma reference voltage VGREF to the data driver 500. The gamma reference voltage VGREF has a value corresponding to each of the data signal DATA.

For example, the gamma reference voltage generator 400 may be disposed in the driving controller 200 or in the data driver 500.

The data driver 500 receives the second control signal CONT2 and the data signal DATA from the driving controller 200 and receives the gamma reference voltage VGREF from the gamma reference voltage generator 400. The data driver 500 converts the data signal DATA into a data voltage having an analog type by using the gamma reference voltage VGREF. The data driver 500 outputs the data voltage to the data line WDL and ADL. The data voltage may have a pulse width data voltage WDATA and a pulse amplitude data voltage ADATA. In the present embodiment, the pulse width data voltage WDATA may include a first pulse width data voltage WDATA1, a second pulse width data voltage WDATA2 and a third pulse width data voltage WDATA3. In the present embodiment, the pulse amplitude data voltage ADATA may include a first pulse amplitude data voltage ADATA1, a second pulse amplitude data voltage ADATA2 and a third pulse amplitude data voltage ADATA3.

In an embodiment of the present inventive concept, the data driver 500 may be integrated on the peripheral region of the display panel 100. In an embodiment of the present inventive concept, the data driver 500 may be mounted on the peripheral region of the display panel 100.

The emission driver 600 generates emission signals WEM and AEM for driving the emission lines WEML and AEML in response to the fourth control signal CONT4 received from the driving controller 200. The emission driver 600 may output the emission signals WEM and AEM to the emission lines WEML and AEML. In the present embodiment the emission signals WEM and AEM may include a first emission signal WEM and a second emission signal AEM.

In an embodiment of the present inventive concept, the emission driver 600 may be integrated on the peripheral region of the display panel 100. In an embodiment of the present inventive concept, the emission driver 600 may be mounted on the peripheral region of the display panel 100.

Although the gate driver 300 is disposed on a first side of the display panel 100, and the emission driver 600 is disposed on a second side of the display panel 100 in FIG. 1 for convenience of explanation, the present inventive concept is not limited thereto. The gate driver 300 and the emission driver 600 may be disposed on the first side of the display panel 100. For example, the gate driver 300 and the emission driver 600 may be disposed on the peripheral region of the display panel 100 on the same side of the display region of the display panel 100. For example, the gate driver 300 and the emission driver 600 may be formed integrally with each other.

Referring to FIG. 1 and FIG. 2, in an embodiment, the display panel 100 may include the pixel PX. The pixel PX may receive the gate signals GW, GI and GI2 from the gate driver 300, may receive the emission signals WEM and AEM from the emission driver 600 and may receive the pulse width data voltage WDATA and the pulse amplitude data voltage ADATA from the data driver 500.

In the present embodiment, the pixel PX may include a sub-pixel SUB-PX. The sub-pixel SUB-PX may emit a color according to a color of a light emitting element. In an embodiment, the light emitting element may be an organic light emitting diode (OLED). However, the present inventive concept is not limited thereto. Alternatively, the light emitting element EE of FIG. 3 may be a nano light emitting diode (NED), a quantum dot (QD) light emitting diode, a micro light emitting diode and an inorganic light emitting diode, or any other suitable light emitting elements. For example, the color may be a red, a green or a blue. However, the present inventive concept is not limited thereto. For example, the number of the sub-pixels SUB-PX included in the pixel PX may be three. However, the present inventive concept is not limited to the number of the sub-pixels SUB-PX. In the present embodiment, the sub-pixel SUB-PX may mean one of a first sub-pixel, a second sub-pixel and a third sub-pixel. Additionally, in an embodiment, a color of a first light emitting element EEA of FIG. 4A of the first sub-pixel, a color of a second light emitting element EEB of FIG. 4B of the second sub-pixel and a color of a third light emitting element EEC of FIG. 4C of the third sub-pixel may be different. However, the present inventive concept is not limited to the color of the first light emitting element EEA of FIG. 4A, the color of the second light emitting element EEB of FIG. 4B and the color of the third light emitting element EEC of FIG. 4C. For example, the color of the first light emitting element EEA of FIG. 4A, the color of the second light emitting element EEB of FIG. 4B and the color of the third light emitting element EEC of FIG. 4C may be the same.

In an embodiment, the pulse width data voltage WDATA and the pulse amplitude data voltage ADATA applied to the first sub-pixel, the second sub-pixel and the third sub-pixel may be different.

Figure 3:
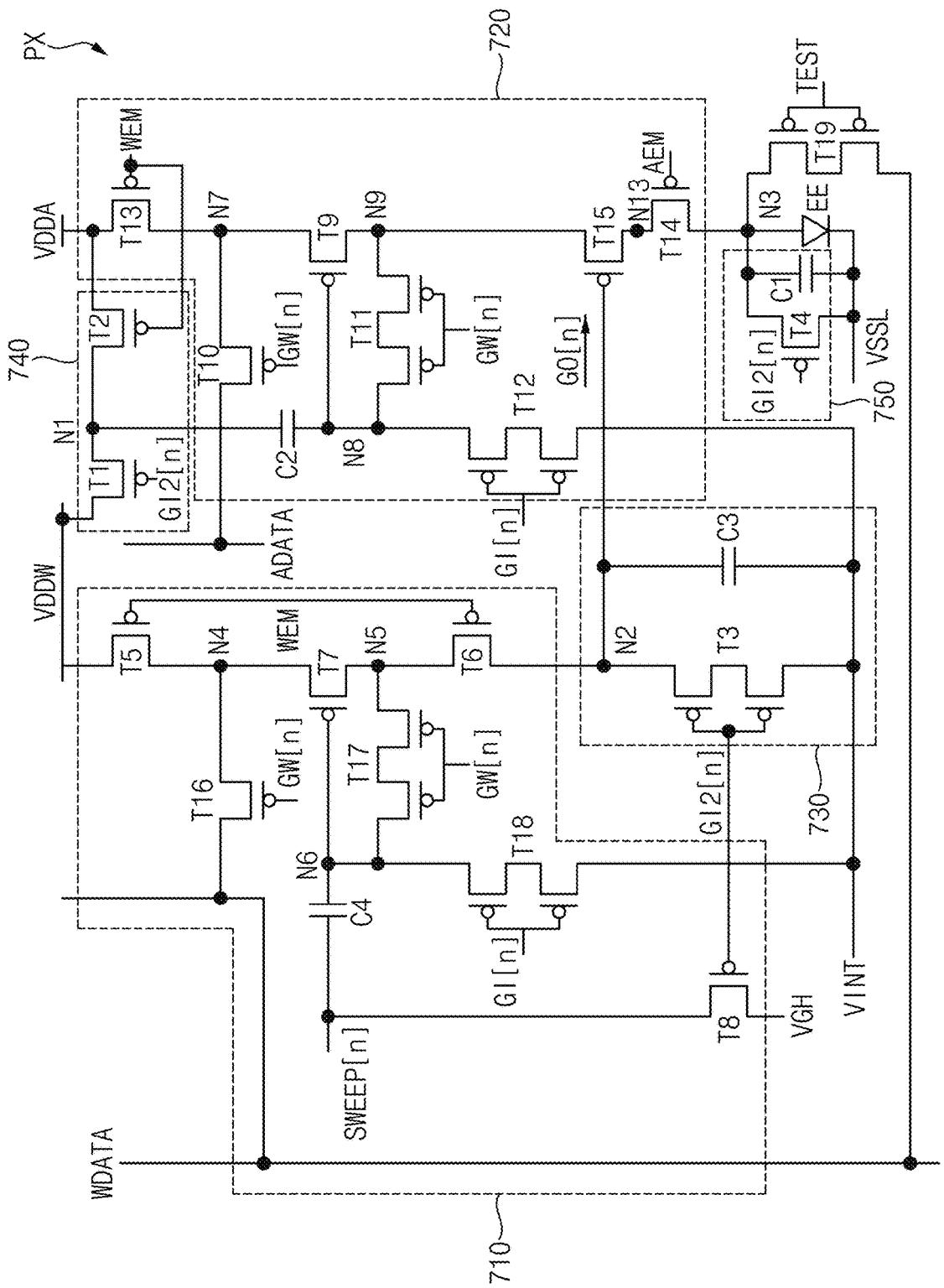
FIG. 3 is a circuit diagram illustrating an example of a pixel included in a display panel of FIG. 2.

FIG. 3 is a circuit diagram illustrating an example of the pixel PX included in the display panel 100 of FIG. 2.

Referring to FIG. 3, the pixel PX may include the sub-pixel SUB-PX including a pulse width modulator 710, a pulse amplitude modulator 720, and a light emitting element EE, an initializer 730, a voltage drop compensator 740, a light emitting element initializer 750 and a sensing transistor T19.

In the present embodiment, the pulse width modulator 710 may include a fifth transistor T5 including a control electrode receiving the first emission signal WEM, a first electrode receiving a first power voltage VDDW and a second electrode connected to a fourth node N4, a sixteenth transistor T16 including a control electrode receiving the write signal GW[n], a first electrode receiving the pulse width data voltage WDATA and a second electrode connected to the fourth node N4, a seventh transistor T7 including a control electrode connected to a sixth node N6, a first electrode connected to the fourth node N4 and a second electrode connected to a fifth node N5, a sixth transistor T6 including a control electrode receiving the first emission signal WEM, a first electrode connected to the fifth node N5 and a second electrode connected to a second node N2, a seventeenth transistor T17 including a control electrode receiving the write signal GW[n], a first electrode connected to the sixth node N6 and a second electrode connected to the fifth node N5, an eighteenth transistor T18 including a control electrode receiving the initialization signal GI[n], a first electrode connected to the sixth node N6 and a second electrode receiving an initialization voltage VINT, an eighth transistor T8 including a control electrode receiving the second initialization signal GI2[n], a first electrode receiving a sweep signal SWEEP[n] and a second electrode receiving a high voltage VGH and a fourth capacitor C4 including a first electrode receiving the sweep signal SWEEP[n] and a second electrode connected to the sixth node N6. For example, the high voltage VGH may be substantially the same as the first power voltage VDDW or a second power voltage VDDA.

The pulse width modulator 710 controls a voltage of the second node N2 by generating a gate output signal GO[n] in response to the pulse width data voltage WDATA. The pulse amplitude modulator 720 may operate in response to the gate output signal GO[n]. A pulse width of a driving current flowing through the light emitting element EE may be controlled by the gate output signal GO[n] of the pulse width modulator 710, so that the pulse width modulator 710 may perform a pulse width modulation of the driving current of the light emitting element EE. For example, the pulse width modulator 710 may control a period of the driving current applied to the light emitting element EE.

In the present embodiment, the voltage drop compensator 740 may include a first transistor T1 including a control electrode receiving the second initialization signal GI2[n], a first electrode receiving the first power voltage VDDW and a second electrode connected to the first node N1 and a second transistor T2 including a control electrode receiving the first emission signal WEM, a first electrode connected to the first node N1 and a second electrode receiving the second power voltage VDDA.

The voltage drop compensator 740 may minimize an influence of a voltage drop of the second power voltage VDDA when a threshold voltage of the pulse amplitude modulator 720 is compensated.

In the present embodiment, the pulse amplitude modulator 720 may include a thirteenth transistor T13 including a control electrode receiving the first emission signal WEM, a first electrode receiving the second power voltage VDDA and a second electrode connected to a seventh node N7, a tenth transistor T10 including a control electrode receiving the write signal GW[n], a first electrode receiving the pulse amplitude data voltage ADATA and a second electrode connected to the seventh node N7, a ninth transistor T9 including a control electrode connected to an eighth node N8, a first electrode connected to the seventh node N7 and a second electrode connected to a ninth node N9, an eleventh transistor T11 including a control electrode receiving the write signal GW[n], a first electrode connected to the eighth node N8 and a second electrode connected to the ninth node N9, a twelfth transistor T12 including a control electrode receiving the initialization signal GI[n], a first electrode connected to the eighth node N8 and a second electrode receiving the initialization voltage VINT, a fourteenth transistor T14 including a control electrode receiving the second emission signal AEM, a first electrode connected to a thirteenth node N13 and a second electrode connected to the third node N3, a fifteenth transistor T15 including a control electrode connected to the second node N2, a first electrode connected to the ninth node N9 and a second electrode connected to the thirteenth node N13 and a second capacitor C2 including a first electrode connected to the first node N1 and a second electrode connected to the eighth node N8.

The pulse amplitude modulator 720 generates the driving current applied to the light emitting element EE in response to the pulse amplitude data voltage ADATA. The pulse amplitude modulator 720 may perform a pulse amplitude modulation. The pulse amplitude modulator 720 may be a constant current generator which generates a constant driving current according to the pulse amplitude data voltage ADATA.

In the present embodiment, the initializer 730 may include a third transistor T3 including a control electrode receiving the second initialization signal GI2[n], a first electrode connected to the second node N2 and a second electrode receiving the initialization voltage VINT and a third capacitor C3 including a first electrode connected to the second node N2 and a second electrode receiving the initialization voltage VINT.

The initializer 730 may initialize the voltage of the second node N2 to the initialization voltage VINT in response to the second initialization signal GI2[n]. For example, the voltage of the second node N2 is initialized to the initialization voltage VINT, so that the gate output signal GO[n] may have the initialization voltage VINT.

In the present embodiment, the light emitting element initializer 750 may include a fourth transistor T4 including a control electrode receiving the second initialization signal GI2[n], a first electrode connected to the third node N3 and a second electrode receiving a third power voltage VSSL and a first capacitor C1 including a first electrode connected to the third node N3 and a second electrode receiving the third power voltage VSSL.

The light emitting element initializer 750 may initialize a voltage of the third node N3 to the third power voltage VSSL in response to the second initialization signal GI2[n].

The sensing transistor T19 may include a control electrode receiving a test signal TEST, a first electrode receiving the pulse width data voltage WDATA and a second electrode connected to the third node N3.

The light emitting element EE may include a first electrode (e.g. an anode) connected to the third node N3 and a second electrode (e.g. a cathode) receiving the third power voltage VSSL.

Figure 4A:
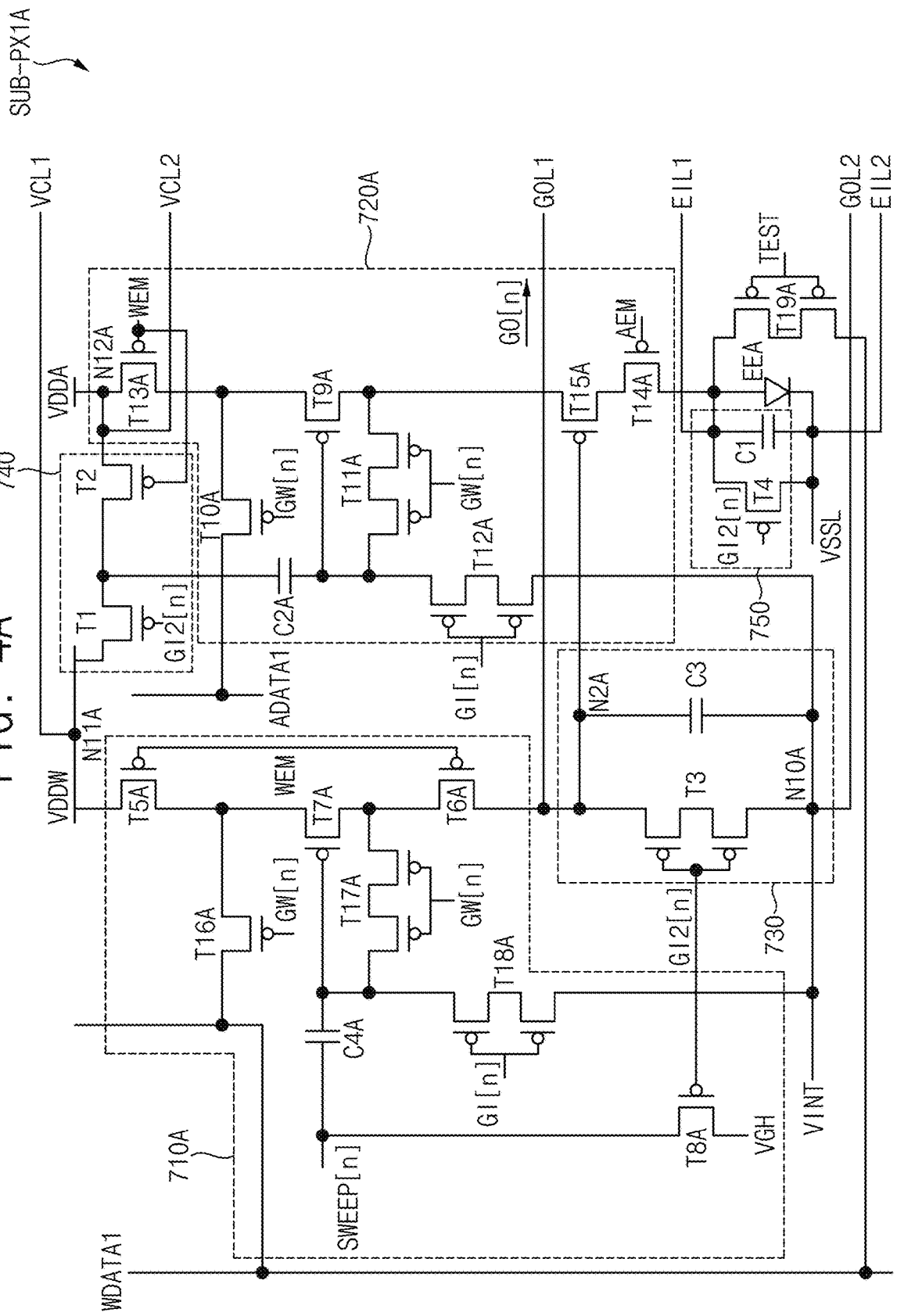
FIG. 4A is a circuit diagram illustrating a first sub-pixel connected to an initializer, a voltage drop compensator and a light emitting element initializer.
Figure 4B:
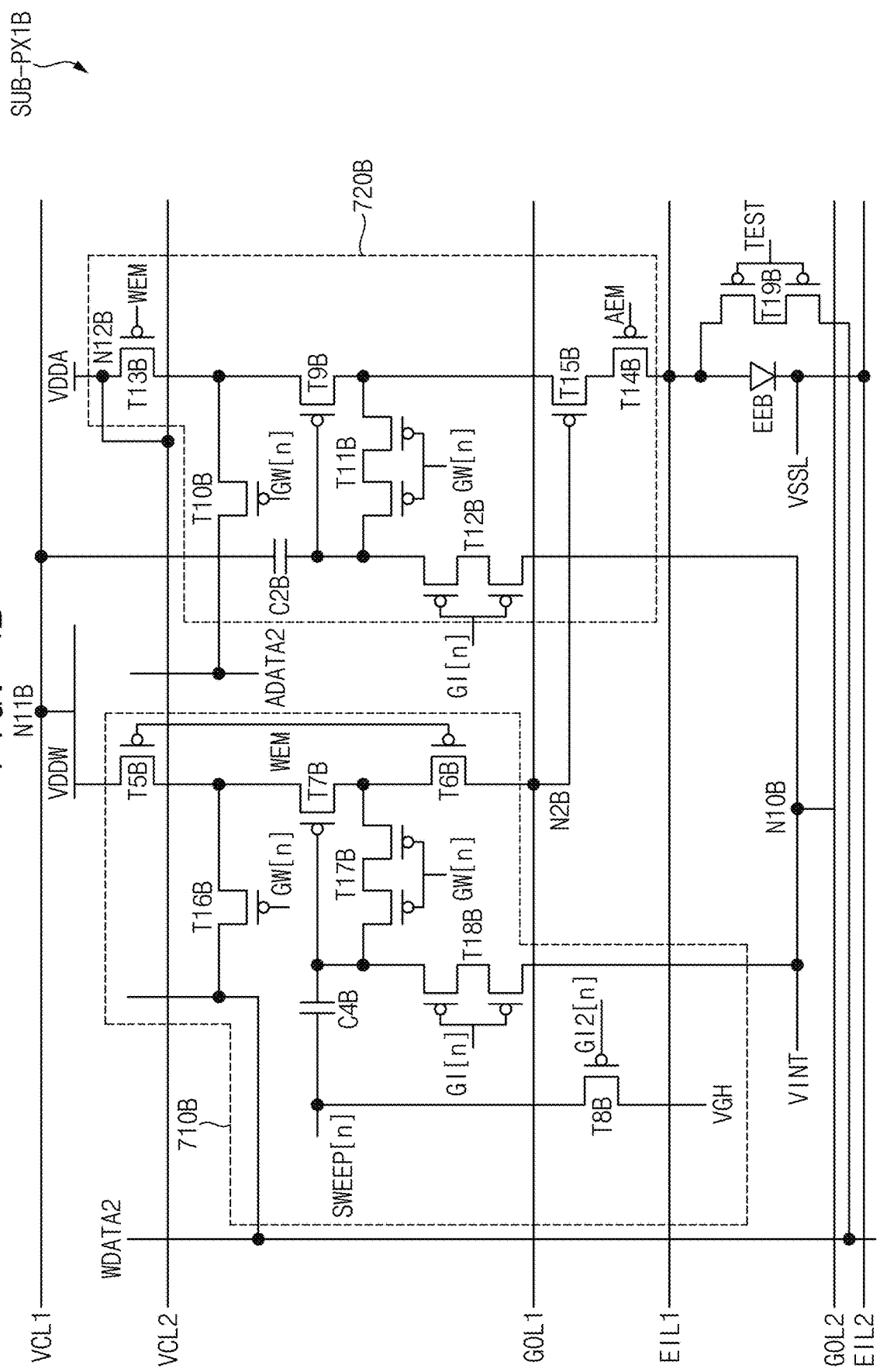
FIG. 4B is a circuit diagram illustrating a second sub-pixel connected to an initializer, a voltage drop compensator and a light emitting element initializer.
Figure 4C:
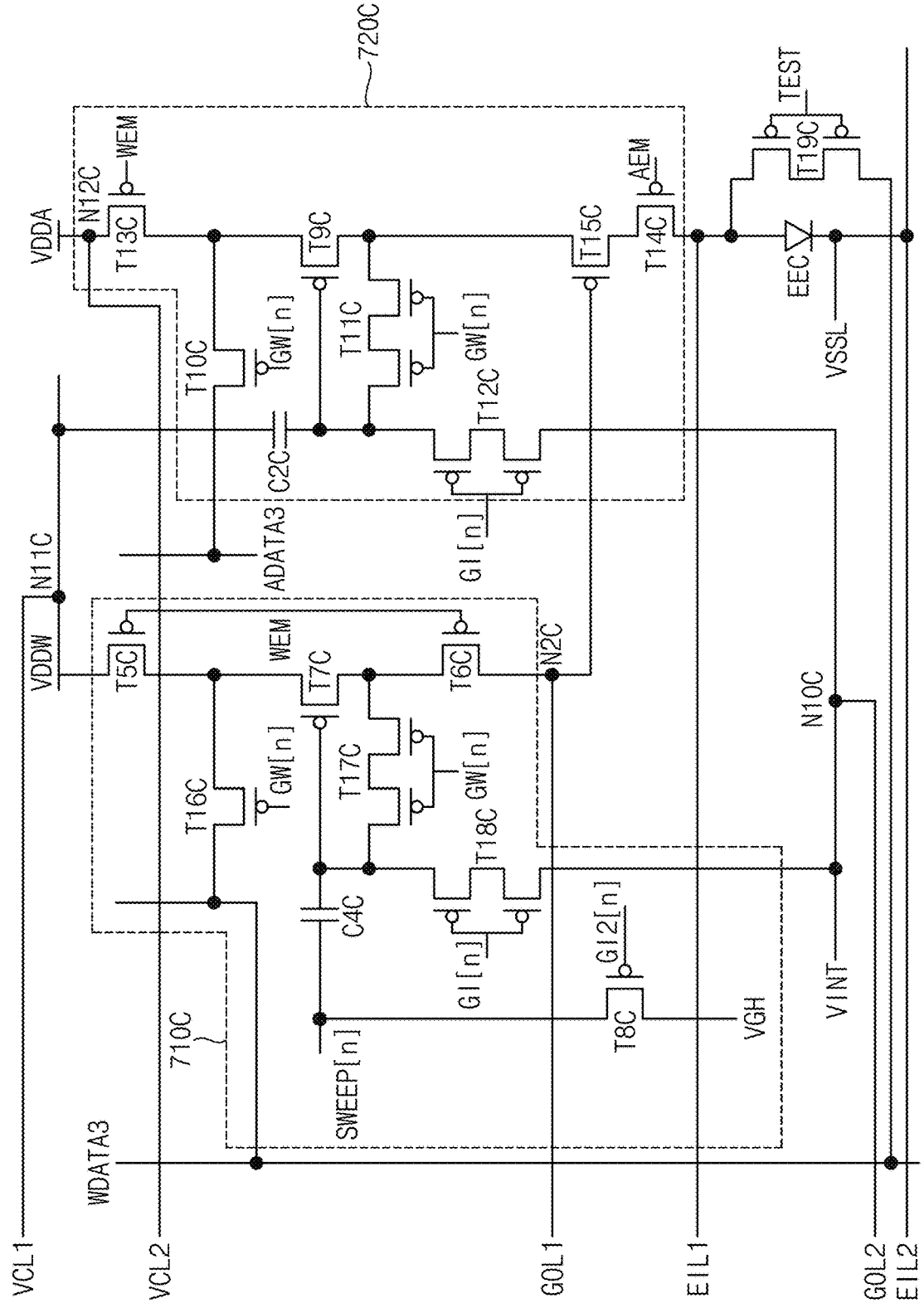
FIG. 4C is a circuit diagram illustrating a third sub-pixel connected to an initializer, a voltage drop compensator and a light emitting element initializer.

FIG. 4A is a circuit diagram illustrating a first sub-pixel SUB-PX1A connected to the initializer 730, the voltage drop compensator 740 and the light emitting element initializer 750. FIG. 4B is a circuit diagram illustrating a second sub-pixel SUB-PX1B connected to the initializer 730, the voltage drop compensator 740 and the light emitting element initializer 750 of FIG. 4A. FIG. 4C is a circuit diagram illustrating a third sub-pixel SUB-PX1C connected to the initializer 730, the voltage drop compensator 740 and the light emitting element initializer 750 of FIG. 4A.

Referring to FIG. 4A and FIG. 4B, in an embodiment, the display panel 100 may include a first gate output signal line GOL1 and a second gate output signal line GOL2.

In the present embodiment, the first sub-pixel SUB-PX1A may include a first pulse width modulator 710A, a first pulse amplitude modulator 720A, a first sensing transistor T19A and the first light emitting element EEA.

The first pulse width modulator 710A may be substantially the same as the pulse width modulator 710 of FIG. 3 except that the first pulse width data voltage WDATA1 is applied to the first pulse width modulator 710A.

For example, the first pulse width modulator 710A may include a fifth transistor T5A, a sixth transistor T6A, a seventh transistor T7A, an eighth transistor T8A, a sixteenth transistor T16A, a seventeenth transistor T17A, an eighteenth transistor T18A and a fourth capacitor C4A.

The first pulse amplitude modulator 720A may be substantially the same as the pulse amplitude modulator 720 of FIG. 3 except that the first pulse amplitude data voltage ADATA1 is applied to the first pulse amplitude modulator 720A.

For example, the first pulse amplitude modulator 720A may include ninth to fifteenth transistors T9A, T10A, T11A, T12A, T13A, T14A, T15A and a second capacitor C2A.

The first sensing transistor T19A may include a control electrode receiving the test signal TEST, a first electrode receiving the first pulse width data voltage WDATA1 and a second electrode connected to an anode of the first light emitting element EEA.

In the present embodiment, the second sub-pixel SUB-PX1B may include a second pulse width modulator 710B, a second pulse amplitude modulator 720B, a second sensing transistor T19B and the second light emitting element EEB.

The second pulse width modulator 710B may be substantially the same as the pulse width modulator 710 of FIG. 3 except that the second pulse width data voltage WDATA2 is applied to the second pulse width modulator 710B.

For example, the second pulse width modulator 710B may include a fifth transistor T5B, a sixth transistor T6B, a seventh transistor T7B, an eighth transistor T8B, a sixteenth transistor T16B, a seventeenth transistor T17B, an eighteenth transistor T18B and a fourth capacitor C4B.

The second pulse amplitude modulator 720B may be substantially the same as the pulse amplitude modulator 720 of FIG. 3 except that the second pulse amplitude data voltage ADATA2 is applied to the second pulse amplitude modulator 720B.

For example, the second pulse amplitude modulator 720B may include ninth to fifteenth transistors T9B, T10B, T11B, T12B, T13B, T14B, T15B and a second capacitor C2B.

The second sensing transistor T19B may include a control electrode receiving the test signal TEST, a first electrode receiving the second pulse width data voltage WDATA2 and a second electrode connected to an anode of the second light emitting element EEB.

The first gate output signal line GOL1 may be connected to a second node N2A of the first pulse width modulator 710A included in the first sub-pixel SUB-PX1A and a second node N2B of the second pulse width modulator 710B included in the second sub-pixel SUB-PX1B. The second gate output signal line GOL2 may be connected to the second electrode of the third transistor T3 included in the initializer 730 and a tenth node N10B of the second sub-pixel SUB-PX1B. Accordingly, the initializer 730 may commonly initialize the first gate output signal of the first sub-pixel SUB-PX1A and the second gate output signal of the second sub-pixel SUB-PX1B.

Each of sub-pixels included in a conventional apparatus may include the initializer 730. However, the initializer 730 according to the present inventive concept is not included in each of the sub pixels SUB-PX, but one initializer 730 may be commonly connected to the first sub-pixel SUB-PX1A and the second sub-pixel SUB-PX1B.

In an embodiment, the display panel 100 may include a first voltage drop compensation line VCL1 and a second voltage drop compensation line VCL2.

The first voltage drop compensation line VCL1 may be connected to an eleventh node N11A of the first sub-pixel SUB-PX1A and an eleventh node N11B of the second sub-pixel SUB-PX1B. The second voltage drop compensation line VCL2 may be connected to a twelfth node N12A of the first sub-pixel SUB-PX1A and a twelfth node N12B of the second sub-pixel SUB-PX1B. Accordingly, the voltage drop compensator 740 may commonly minimize an influence of a voltage drop of the second power voltage VDDA when a threshold voltage of the first pulse amplitude modulator 720A and a threshold voltage of the second pulse amplitude modulator 720B are compensated.

Each of sub-pixels included in a conventional apparatus may include the voltage drop compensator 740. However, the voltage drop compensator 740 according to the present inventive concept is not included in each of the sub pixels SUB-PX, but one voltage drop compensator 740 may be commonly connected to the first sub-pixel SUB-PX1A and the second sub-pixel SUB-PX1B.

In an embodiment, the display panel 100 may include a first light emitting element initialization line EIL1 and a second light emitting element initialization line EIL2.

The first light emitting element initialization line EIL1 may be connected to an anode of the first light emitting element EEA included in the first sub-pixel SUB-PX1A and an anode of the second light emitting element EEB included in the second sub-pixel SUB-PX1B. The second light emitting element initialization line EIL2 may be connected to a cathode of the first light emitting element EEA included in the first sub-pixel SUB-PX1A and a cathode of the second light emitting element EEB included in the second sub-pixel SUB-PX1B. Accordingly, the light emitting element initializer 750 may commonly initialize the first light emitting element EEA and the second light emitting element EEB.

Each of sub-pixels included in a conventional apparatus may include the initializer 730, the voltage drop compensator 740 and the light emitting element initializer 750. However, the initializer 730, the voltage drop compensator 740 and the light emitting element initializer 750 according to the present inventive concept are not included in each of the sub pixels SUB-PX, but at least one of the initializer 730, the voltage drop compensator 740 and the light emitting element initializer 750 may be commonly connected to the first sub-pixel SUB-PX1A and the second sub-pixel SUB-PX1B. Accordingly, the pixel PX of the present inventive concept may have a reduced number of transistors and capacitors compared to a conventional pixel. Accordingly, integration of the pixel PX may be improved and a yield of the pixel PX may be improved. Additionally, the pixel PX may be applied to an ultra-high resolution display apparatus. The integration of the pixel PX is improved, so that products using the display panel 100 suitable for an ultra-high resolution and low power consumption may be produced.

Additionally, although the initializer 730, the voltage drop compensator 740 and the light emitting element initializer 750 according to the present inventive concept are not included in each of the sub pixels SUB-PX, but at least one of the initializer 730, the voltage drop compensator 740 and the light emitting element initializer 750 may be commonly connected to the first sub-pixel SUB-PX1A and the second sub-pixel SUB-PX1B, the driving current applied to the pixel PX of the light emitting element EE may be substantially the same as a driving current applied to a light emitting element of a conventional pixel.

Referring to FIG. 4A, FIG. 4B and FIG. 4C, the first gate output signal line GOL1 may be connected to the second node N2A of the first pulse width modulator 710A included in the first sub-pixel SUB-PX1A, the second node N2B of the second pulse width modulator 710B included in the second sub-pixel SUB-PX1B and a third node N2C of a third pulse width modulator 710C included in the third sub-pixel SUB-PX1C. The second gate output signal line GOL2 may be connected to the second electrode of the third transistor T3 included in the initializer 730, the tenth node N10B of the second sub-pixel SUB-PX1B and a tenth node N10C of the third sub-pixel SUB-PX1C. Accordingly, the initializer 730 may commonly initialize the first gate output signal of the first sub-pixel SUB-PX1A, the second gate output signal of the second sub-pixel SUB-PX1B and the third gate output signal of the third sub-pixel SUB-PX1C.

In the present embodiment, the third sub-pixel SUB-PX1C may include the third pulse width modulator 710C, a third pulse amplitude modulator 720C, a third sensing transistor T19C and the third light emitting element EEC.

The third pulse width modulator 710C may be substantially the same as the pulse width modulator 710 of FIG. 3 except that the third pulse width data voltage WDATA3 is applied to the third pulse width modulator 710C.

For example, the third pulse width modulator 710C may include a fifth transistor T5C, a sixth transistor T6C, a seventh transistor T7C, an eighth transistor T8C, a sixteenth transistor T16C, a seventeenth transistor T17C, an eighteenth transistor T18C and a fourth capacitor C4C.

The third pulse amplitude modulator 720C may be substantially the same as the pulse amplitude modulator 720 of FIG. 3 except that the third pulse amplitude data voltage ADATA3 is applied to the third pulse amplitude modulator 720C.

For example, the third pulse amplitude modulator 720C may include ninth to fifteenth transistors T9C, T10C, T11C, T12C, T13C, T14C and T15C and a second capacitor C2C.

The third sensing transistor T19C may include a control electrode receiving the test signal TEST, a first electrode receiving the third pulse width data voltage WDATA3 and a second electrode connected to an anode of the third light emitting element EEC.

In an embodiment, the first voltage drop compensation line VCL1 may be connected to the eleventh node N11A of the first sub-pixel SUB-PX1A, the eleventh node N11B of the second sub-pixel SUB-PX1B and an eleventh node N11C of the third sub-pixel SUB-PX1C. The second voltage drop compensation line VCL2 may be connected to the twelfth node N12A of the first sub-pixel SUB-PX1A, the twelfth node N12B of the second sub-pixel SUB-PX1B and a twelfth node N12C of the third sub-pixel SUB-PX1C. Accordingly, the voltage drop compensator 740 may commonly minimize an influence of a voltage drop of the second power voltage VDDA when the threshold voltage of the first pulse amplitude modulator 720A, the threshold voltage of the second pulse amplitude modulator 720B and a threshold voltage of the third pulse amplitude modulator 720C are compensated.

In an embodiment, the first light emitting element initialization line EIL1 may be connected to the anode of the first light emitting element EEA included in the first sub-pixel SUB-PX1A, the anode of the second light emitting element EEB included in the second sub-pixel SUB-PX1B and an anode of the third light emitting element EEC included in the third sub-pixel SUB-PX1C. The second light emitting element initialization line EIL2 may be connected to the cathode of the first light emitting element EEA included in the first sub-pixel SUB-PX1A, the cathode of the second light emitting element EEB included in the second sub-pixel SUB-PX1B and a cathode of the third light emitting element EEC included in the third sub-pixel SUB-PX1C. Accordingly, the light emitting element initializer 750 may commonly initialize the first light emitting element EEA, the second light emitting element EEB and the third light emitting element EEC.

A sub-pixel included in a conventional apparatus, each of the sub-pixel included in the conventional apparatus may have the initializer 730, the voltage drop compensator 740 and the light emitting element initializer 750. However, the initializer 730, the voltage drop compensator 740 and the light emitting element initializer 750 according to the present inventive concept are not included each of the sub pixels SUB-PX, but at least one of the initializer 730, the voltage drop compensator 740 and the light emitting element initializer 750 may be commonly connected to the first sub-pixel SUB-PX1A, the second sub-pixel SUB-PX1B and the third sub-pixel SUB-PX1C. Accordingly, the pixel PX of the present inventive concept may have a reduced number of transistors and capacitors compared to a conventional pixel. Accordingly, integration of the pixel PX may be improved and a yield of the pixel PX may be improved. Additionally, the pixel PX may be applied to an ultra-high resolution display apparatus. The integration of the pixel PX is improved, so that products using the display panel 100 suitable for an ultra-high resolution and low power consumption may be produced.

Additionally, although the initializer 730, the voltage drop compensator 740 and the light emitting element initializer 750 according to the present inventive concept are not included in each of the sub pixels SUB-PX, but at least one of the initializer 730, the voltage drop compensator 740 and the light emitting element initializer 750 may be commonly connected to the first sub-pixel SUB-PX1A, the second sub-pixel SUB-PX1B and the third sub-pixel SUB-PX1C, the driving current applied to the pixel PX of the light emitting element EE may be substantially the same as a driving current applied to a light emitting element of a conventional pixel.

Figure 5A:
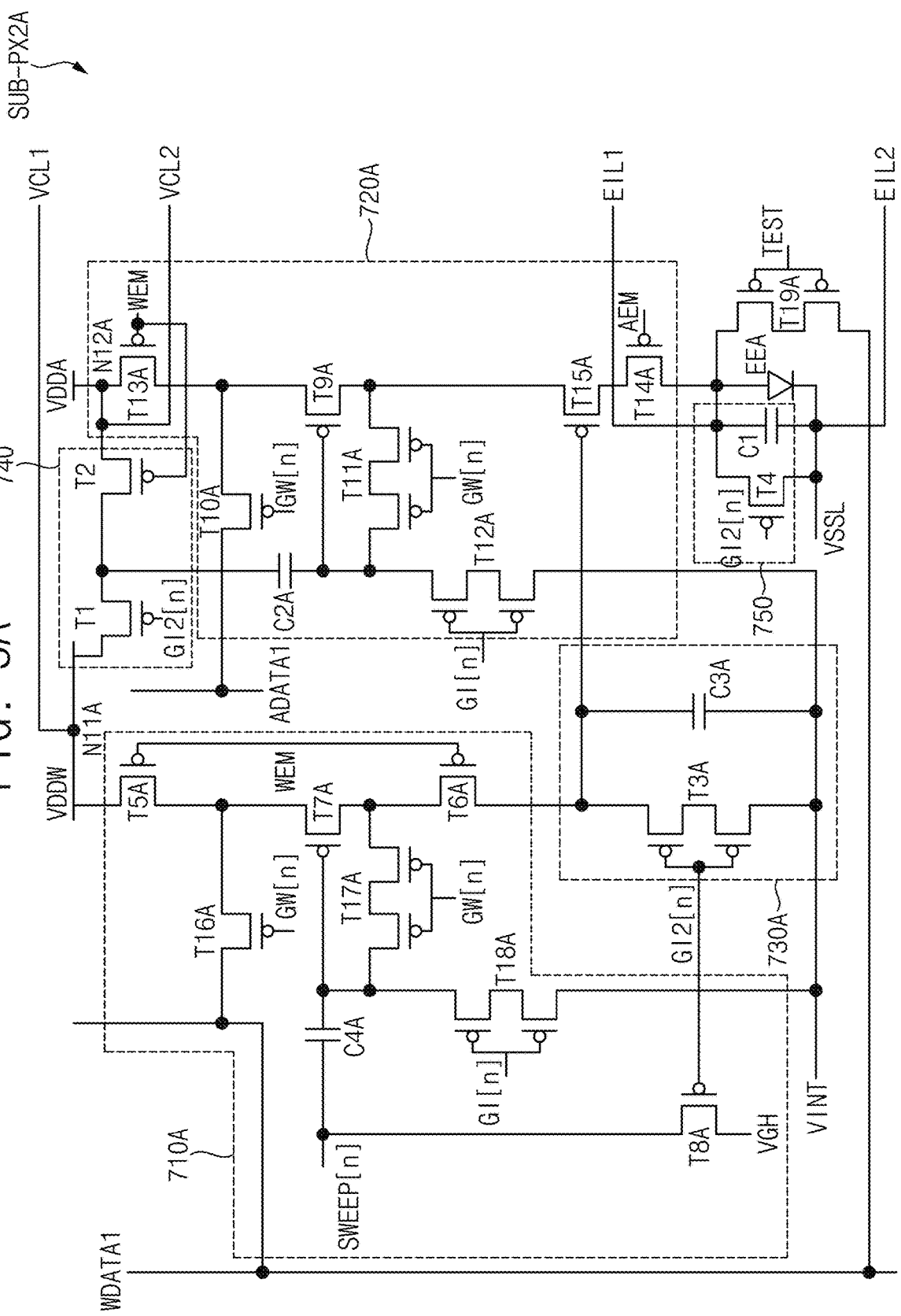
FIG. 5A is a circuit diagram illustrating a first sub-pixel connected to a voltage drop compensator and a light emitting element initializer in an embodiment.
Figure 5B:
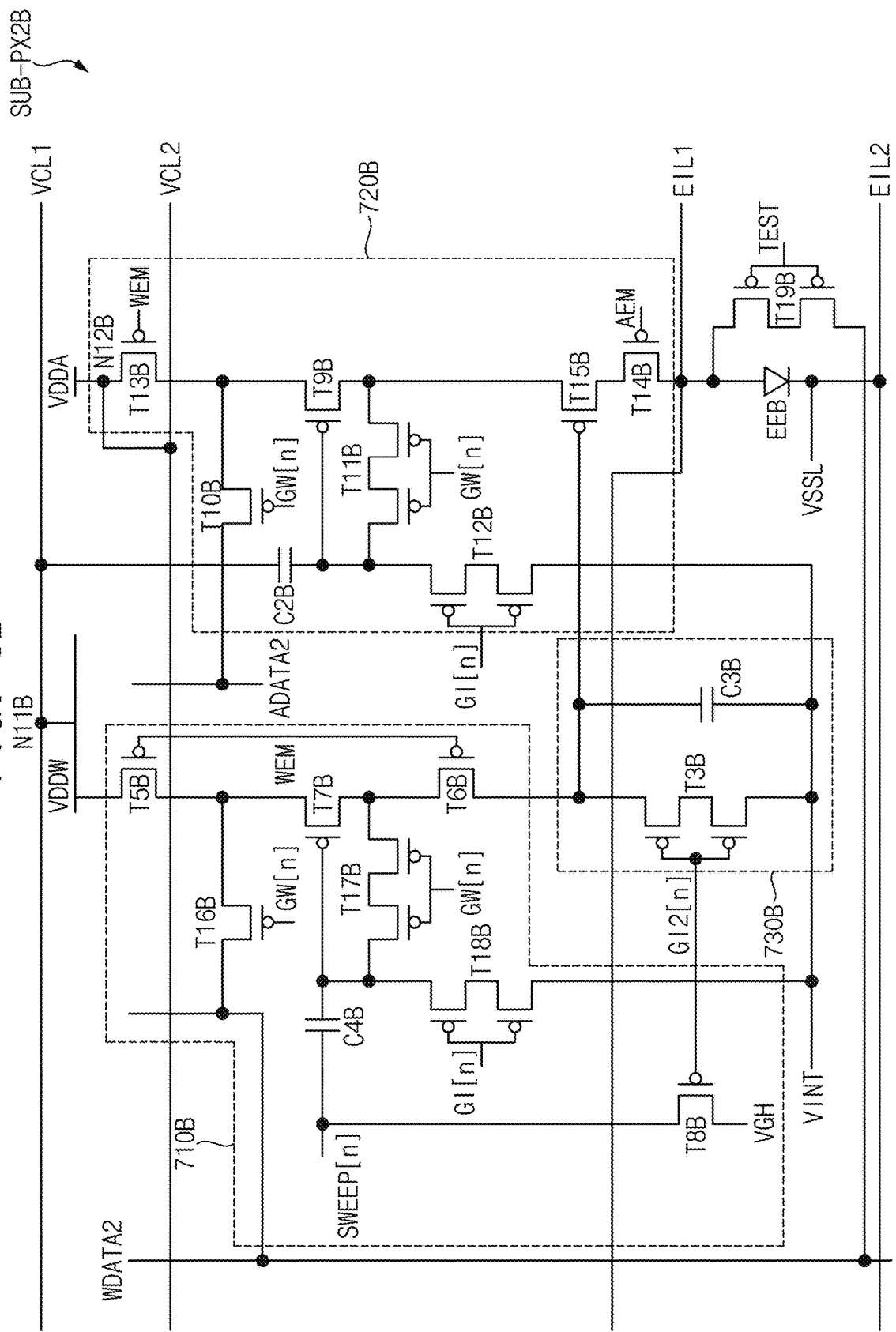
FIG. 5B is a circuit diagram illustrating a second sub-pixel connected to a voltage drop compensator and the light emitting element initializer in an embodiment.
Figure 5C:
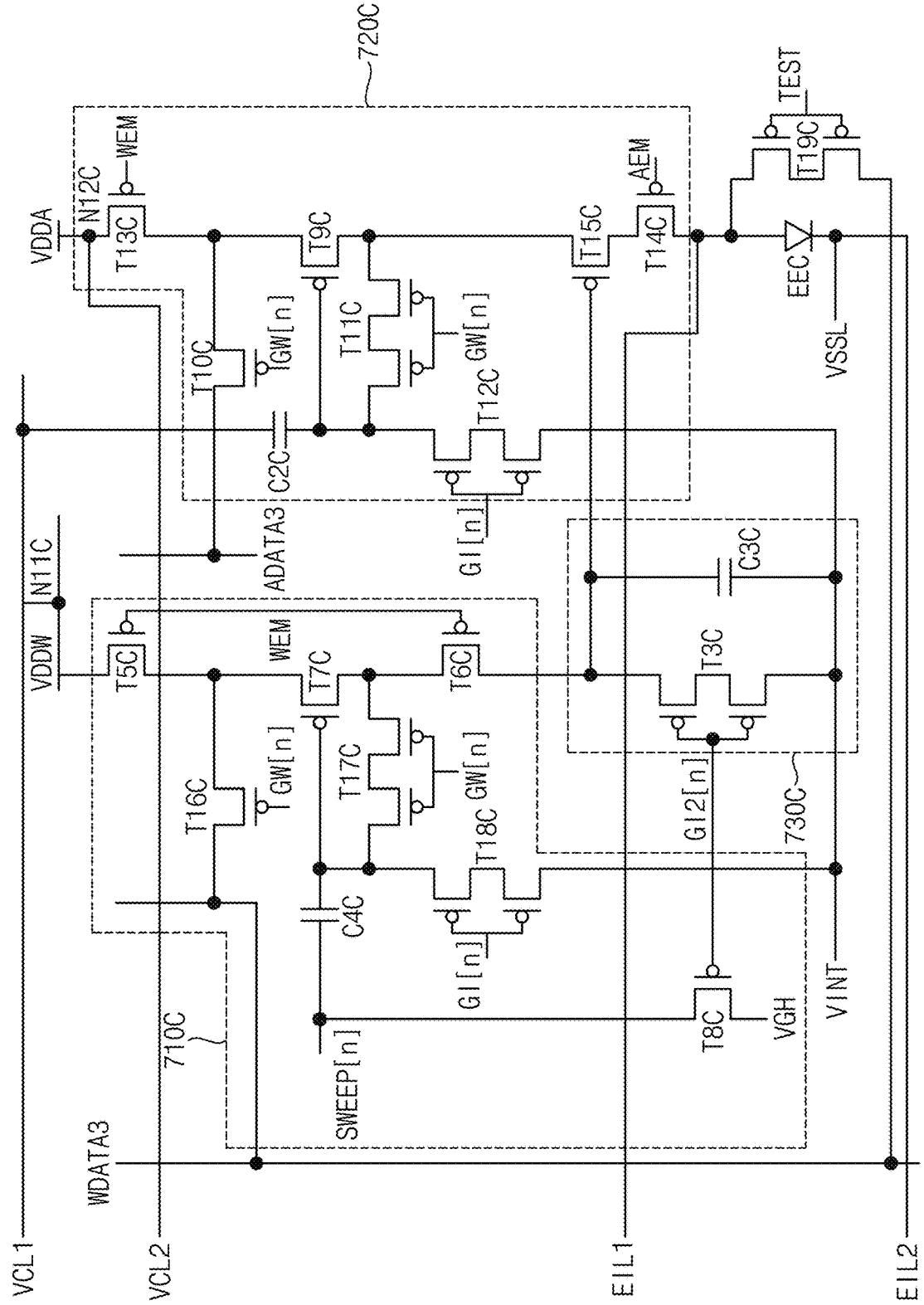
FIG. 5C is a circuit diagram illustrating a third sub-pixel connected to a voltage drop compensator and a light emitting element initializer in an embodiment.

FIG. 5A is a circuit diagram illustrating a first sub-pixel SUB-PX2A connected to a voltage drop compensator 740 and a light emitting element initializer 750 in an embodiment. FIG. 5B is a circuit diagram illustrating a second sub-pixel SUB-PX2B connected to a voltage drop compensator 740 and a light emitting element initializer 750 in an embodiment. FIG. 5C is a circuit diagram illustrating a third sub-pixel SUB-PX2C connected to a voltage drop compensator 740 and a light emitting element initializer 750 in an embodiment.

The pixel PX according to the present embodiment is substantially the same as the pixel PX of FIG. 4A to FIG. 4C except that the first sub-pixel SUB-PX2A includes a first initializer 730A, the second sub-pixel SUB-PX2B includes a second initializer 730B, the third sub-pixel SUB-PX2C includes a third initializer 730C, the first voltage drop compensation line VCL1 and the second voltage drop compensation line VCL2 is connected to the first to third sub-pixel SUB-PX2A, SUB-PX2B and SUB-PX2C and the first light emitting element initialization line EIL1 and the second light emitting element initialization line EIL2 is connected to the first to third sub-pixel SUB-PX2A, SUB-PX2B and SUB-PX2C. The same reference numbers are used for components that are the same or similar to those in the previous embodiment, and overlapping descriptions are omitted.

In the present embodiment, each of the first sub-pixel SUB-PX2A, the second sub-pixel SUB-PX2B and the third sub-pixel SUB-PX2C may include the initializer 730. For example, the initializer 730 included in the first sub-pixel SUB-PX2A may be called as the first initializer 730A. For example, the initializer 730 included in the second sub-pixel SUB-PX2B may be called as the second initializer 730B. For example, the initializer 730 included in the third sub-pixel SUB-PX2C may be called as third initializer 730C.

For example, the first initializer 730A may include a third transistor T3A and a third capacitor C3A, the second initializer 730B may include a third transistor T3B and a third capacitor C3B and the third initializer 730C may include a third transistor T3C and a third capacitor C3C.

In an embodiment, the first voltage drop compensation line VCL1 may be connected to an eleventh node N11A of the first sub-pixel SUB-PX2A, an eleventh node N11B of the second sub-pixel SUB-PX2B and an eleventh node N11C of the third sub-pixel SUB-PX2C. The second voltage drop compensation line VCL2 may be connected to a twelfth node N12A of the first sub-pixel SUB-PX2A, a twelfth node N12B of the second sub-pixel SUB-PX2B and a twelfth node N12C of the third sub-pixel SUB-PX2C.

In an embodiment, the first light emitting element initialization line EIL1 may be connected to an anode of the first light emitting element EEA included in the first sub-pixel SUB-PX2A, an anode of the second light emitting element EEB included in the second sub-pixel SUB-PX2B and an anode of the third light emitting element EEC included in the third sub-pixel SUB-PX2C. The second light emitting element initialization line EIL2 may be connected to the cathode of the first light emitting element EEA included in the first sub-pixel SUB-PX2A, the cathode of the second light emitting element EEB included in the second sub-pixel SUB-PX2B and a cathode of the third light emitting element EEC included in the third sub-pixel SUB-PX2C.

A sub-pixel included in a conventional apparatus, each of the sub-pixel included in the conventional apparatus may have the voltage drop compensator 740 and the light emitting element initializer 750. However, the voltage drop compensator 740 and the light emitting element initializer 750 according to the present inventive concept are not included in each of the sub pixels SUB-PX, but at least one of the voltage drop compensator 740 and the light emitting element initializer 750 may be commonly connected to the first sub-pixel SUB-PX2A, the second sub-pixel SUB-PX2B and the third sub-pixel SUB-PX2C. Accordingly, the pixel PX of the present inventive concept may have a reduced number of transistors and capacitors compared to a conventional pixel. Accordingly, integration of the pixel PX may be improved and a yield of the pixel PX may be improved. Additionally, the pixel PX may be applied to an ultra-high resolution display apparatus. The integration of the pixel PX is improved, so that products using the display panel 100 suitable for an ultra-high resolution and low power consumption may be produced.

Figure 6:
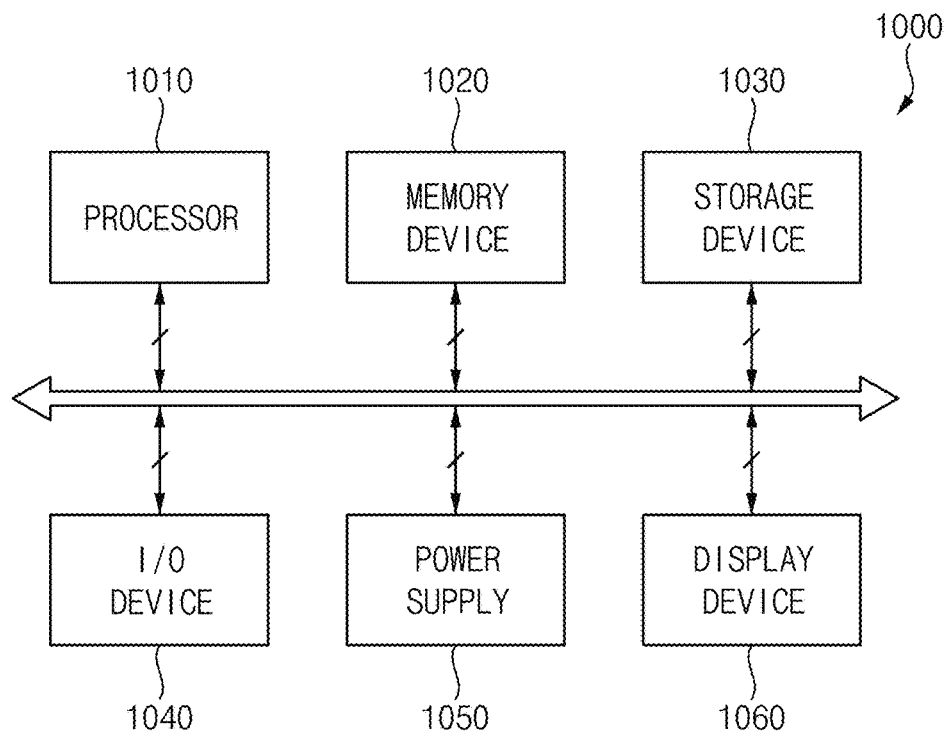
FIG. 6 is a block diagram illustrating an electronic apparatus according to an embodiment of the present inventive concept.
Figure 7:
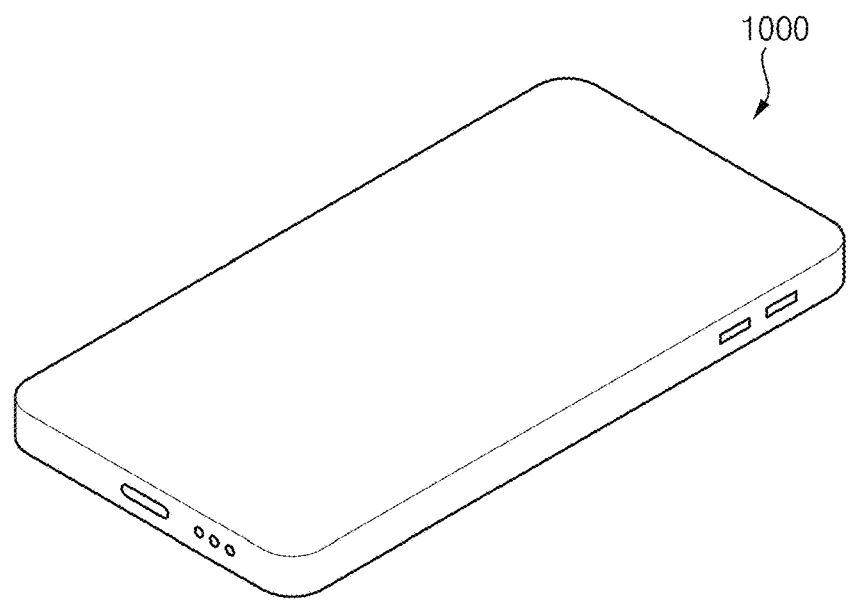
FIG. 7 is a diagram illustrating an example in which the electronic apparatus of FIG. 6 is implemented as a smart phone.

FIG. 6 is a block diagram illustrating an electronic apparatus according to an embodiment of the present inventive concept. FIG. 7 is a view illustrating an example in which the electronic apparatus of FIG. 6 is implemented as a smart phone.

Referring to FIG. 6 and FIG. 7, the electronic apparatus 1000 may include a processor 1010, a memory device 1020, a storage device 1030, an input/output (I/O) device 1040, a power supply 1050 and a display device 1060. Here, the display device 1060 may be the display apparatus of FIG. 1. In addition, the electronic apparatus 1000 may further include a plurality of ports for communicating with a video card, a sound card, a memory card, a universal serial bus (USB) device, other electronic apparatuses, etc.

According to an embodiment, as shown in FIG. 7, the electronic apparatus 1000 may be implemented as a smart phone. However, the electronic apparatus 1000 is not limited thereto. For example, the electronic apparatus 1000 may be implemented as a cellular phone, a video phone, a smart pad, a smart watch, a tablet PC, a car navigation system, a computer monitor, a laptop, a head mounted display (HMD) device and the like.

The processor 1010 may perform various computing functions or various tasks. The processor 1010 may be a micro-processor, a central processing unit (CPU), an application processor (AP) and the like. The processor 1010 may be coupled to other components via an address bus, a control bus, a data bus, etc. Further, the processor 1010 may be coupled to an extended bus such as a peripheral component interconnection (PCI) bus.

The processor 1010 may output the input image data IMG and the input control signal CONT to the driving controller 200 of FIG. 1.

The memory device 1020 may store data for operations of the electronic apparatus 1000. For example, the memory device 1020 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device and the like and/or at least one volatile memory device such as a dynamic random access memory (DRAM) device, a static random access memory (SRAM) device, a mobile DRAM device and the like.

The storage device 1030 may include a solid state drive (SSD) device, a hard disk drive (HDD) device, a CD-ROM device and the like. The I/O device 1040 may include an input device such as a keyboard, a keypad, a mouse device, a touch-pad, a touch-screen and the like and an output device such as a printer, a speaker and the like. In some embodiments, the display device 1060 may be included in the I/O device 1040. The power supply 1050 may provide power for operations of the electronic apparatus 1000. The display device 1060 may be coupled to other components via the buses or other communication links.

According to the display apparatus of the present inventive concept described above, an ultra-high resolution display apparatus may be implemented using a pixel having high integration.

The foregoing is illustrative of the present inventive concept and is not to be construed as limiting thereof. Although embodiments of the present inventive concept have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of the present inventive concept and is not to be construed as limited to the specific embodiments disclosed and that modifications to the disclosed embodiments, as well as other embodiments, are intended to be included within the scope of the appended claims. The present inventive concept is defined by the following claims, with equivalents of the claims to be included therein.

What is claimed is:

1. A display apparatus comprising:
   a display panel including a pixel;
   a data driver configured to provide data voltages to the pixel;
   an emission driver configured to provide an emission signal to the pixel;
   a gate driver configured to provide a gate signal to the pixel; and
   a driving controller configured to control the data driver and the emission driver,
   wherein the pixel comprises:
   a first sub-pixel including a first pulse width modulator configured to output a first gate output signal for a pulse width modulation in response to a first pulse width data voltage and configured to control a period of a first driving current applied to a first light emitting element and a first pulse amplitude modulator configured to apply the first driving current to the first light emitting element in response to a first pulse amplitude data voltage different from the first pulse width data voltage;
   a second sub-pixel including a second pulse width modulator configured to output a second gate output signal for the pulse width modulation in response to a second pulse width data voltage different from the first pulse width data voltage and configured to control a period of a second driving current applied to a second light emitting element and a second pulse amplitude modulator configured to apply the second driving current to the second light emitting element in response to a second pulse amplitude data voltage different from the second pulse width data voltage; and
   an initializer configured to initialize the first gate output signal and the second gate output signal in response to a second initialization signal.

2. The display apparatus of claim 1, wherein the initializer comprises a third transistor including a control electrode configured to receive the second initialization signal, a first electrode connected to a second node and a second electrode configured to receive an initialization voltage.

3. The display apparatus of claim 1, wherein the pixel further comprises a voltage drop compensator configured to compensate a voltage drop of the first pulse amplitude modulator and a voltage drop of the second pulse amplitude modulator.

4. The display apparatus of claim 3, wherein the voltage drop compensator comprises:
   a first transistor including a control electrode configured to receive the second initialization signal, a first electrode configured to receive a first power voltage and a second electrode connected to a first node; and
   a second transistor including a control electrode configured to receive a first emission signal, a first electrode connected to the first node and a second electrode configured to receive a second power voltage.

5. The display apparatus of claim 1, wherein the pixel further comprises a light emitting element initializer configured to initialize the first light emitting element and the second light emitting element in response to the second initialization signal.

6. The display apparatus of claim 5, wherein the light emitting element initializer comprises:
   a fourth transistor including a control electrode configured to receive the second initialization signal, a first electrode connected to a third node and a second electrode configured to receive a third power voltage; and
   a first capacitor including a first electrode connected to the third node and a second electrode configured to receive the third power voltage.

7. The display apparatus of claim 1, wherein the pixel further comprises:
   a voltage drop compensator configured to compensate a voltage drop of the first pulse amplitude modulator and a voltage drop of the second pulse amplitude modulator; and
   a light emitting element initializer configured to initialize the first light emitting element and the second light emitting element in response to the second initialization signal.

8. The display apparatus of claim 7, wherein the voltage drop compensator comprises:
   a first transistor including a control electrode configured to receive the second initialization signal, a first electrode configured to receive a first power voltage and a second electrode connected to a first node; and
   a second transistor including a control electrode configured to receive a first emission signal, a first electrode connected to the first node and a second electrode configured to receive a second power voltage, and
   wherein the light emitting element initializer comprises:
   a fourth transistor including a control electrode configured to receive the second initialization signal, a first electrode connected to a third node and a second electrode configured to receive a third power voltage; and a first capacitor including a first electrode connected to the third node and a second electrode configured to receive the third power voltage.

9. The display apparatus of claim 1, wherein the pixel further comprises a third sub-pixel including a third pulse width modulator configured to output a third gate output signal for the pulse width modulation in response to a third pulse width data voltage different from the first pulse width data voltage and the second pulse width data voltage and configured to control a period of a third driving current applied to a third light emitting element and a third pulse amplitude modulator configured to apply the third driving current to the third light emitting element in response to a third pulse amplitude data voltage different from the third pulse width data voltage and
wherein the initializer is configured to initialize the first gate output signal, the second gate output signal and the third gate output signal in response to the second initialization signal.

10. The display apparatus of claim 9, wherein the pixel further comprises a voltage drop compensator configured to compensate a voltage drop of the first pulse amplitude modulator, a voltage drop of the second pulse amplitude modulator and a voltage drop of the third pulse amplitude modulator.

11. The display apparatus of claim 9, wherein the pixel further comprises a light emitting element initializer configured to initialize the first light emitting element, the second light emitting element and the third light emitting element in response to the second initialization signal.

12. The display apparatus of claim 9, wherein the pixel further comprises:
a voltage drop compensator configured to compensate a voltage drop of the first pulse amplitude modulator, a voltage drop of the second pulse amplitude modulator and a voltage drop of the third pulse amplitude modulator; and
a light emitting element initializer configured to initialize the first light emitting element, the second light emitting element and the third light emitting element in response to the second initialization signal.

13. The display apparatus of claim 12, wherein the voltage drop compensator comprises:
a first transistor including a control electrode configured to receive the second initialization signal, a first electrode configured to receive a first power voltage and a second electrode connected to a first node; and
a second transistor including a control electrode configured to receive a first emission signal, a first electrode connected to the first node and a second electrode configured to receive a second power voltage, and
wherein the light emitting element initializer comprises:
a fourth transistor including a control electrode configured to receive the second initialization signal, a first electrode connected to a third node and a second electrode configured to receive a third power voltage; and
a first capacitor including a first electrode connected to the third node and a second electrode configured to receive the third power voltage.

14. A display apparatus comprising:
a display panel including a pixel;
a data driver configured to provide data voltages to the pixel;
an emission driver configured to provide an emission signal to the pixel;
a gate driver configured to provide a gate signal to the pixel; and
a driving controller configured to control the data driver and the emission driver,
wherein the pixel comprises:
a first sub-pixel including a first pulse width modulator configured to output a first gate output signal for a pulse width modulation in response to a first pulse width data voltage and configured to control a period of a first driving current applied to a first light emitting element, a first pulse amplitude modulator configured to apply the first driving current to the first light emitting element in response to a first pulse amplitude data voltage different from the first pulse width data voltage and a first initializer configured to initialize the first gate output signal in response to a second initialization signal;
a second sub-pixel including a second pulse width modulator configured to output a second gate output signal for the pulse width modulation in response to a second pulse width data voltage different from the first pulse width data voltage and configured to control a period of a second driving current applied to a second light emitting element, a second pulse amplitude modulator configured to apply the second driving current to the second light emitting element in response to a second pulse amplitude data voltage different from the second pulse width data voltage and a second initializer configured to initialize the second gate output signal in response to the second initialization signal; and
a voltage drop compensator configured to compensate a voltage drop of the first pulse amplitude modulator and a voltage drop of the second pulse amplitude modulator.

15. The display apparatus of claim 14, wherein the pixel further comprises a light emitting element initializer configured to initialize the first light emitting element and the second light emitting element in response to the second initialization signal.

16. The display apparatus of claim 14, wherein the pixel further comprises a third sub-pixel including a third pulse width modulator configured to output a third gate output signal for the pulse width modulation in response to a third pulse width data voltage different from the first pulse width data voltage and the second pulse width data voltage and configured to control a period of a third driving current applied to a third light emitting element, a third pulse amplitude modulator configured to apply the third driving current to the third light emitting element in response to a third pulse amplitude data voltage different from the third pulse width data voltage and a third initializer configured to initialize the third gate output signal in response to the second initialization signal, and
wherein the voltage drop compensator is configured to compensate a voltage drop of the first pulse amplitude modulator, a voltage drop of the second pulse amplitude modulator and a voltage drop of the third pulse amplitude modulator.

17. The display apparatus of claim 16, wherein the pixel further comprises a light emitting element initializer configured to initialize the first light emitting element, the second light emitting element and the third light emitting element in response to the second initialization signal.

18. The display apparatus of claim 17, wherein the voltage drop compensator comprises:
a first transistor including a control electrode configured to receive the second initialization signal, a first electrode configured to receive a first power voltage and a second electrode connected to a first node; and a second transistor including a control electrode configured to receive a first emission signal, a first electrode connected to the first node and a second electrode configured to receive a second power voltage, and wherein the light emitting element initializer comprises:

a fourth transistor including a control electrode configured to receive the second initialization signal, a first electrode connected to a third node and a second electrode configured to receive a third power voltage; and a first capacitor including a first electrode connected to the third node and a second electrode configured to receive the third power voltage.

19. A display apparatus comprising:

a display panel including a pixel;

a data driver configured to provide data voltages to the pixel;

an emission driver configured to provide an emission signal to the pixel;

a gate driver configured to provide a gate signal to the pixel; and a driving controller configured to control the data driver and the emission driver, wherein the pixel comprises:

a first sub-pixel including a first pulse width modulator configured to output a first gate output signal for a pulse width modulation in response to a first pulse width data voltage and configured to control a period of a first driving current applied to a first light emitting element, a first pulse amplitude modulator configured to apply the first driving current to the first light emitting element in response to a first pulse amplitude data voltage different from the first pulse width data voltage and a first initializer configured to initialize the first gate output signal in response to a second initialization signal;

a second sub-pixel including a second pulse width modulator configured to output a second gate output signal for the pulse width modulation in response to a second pulse width data voltage different from the first pulse width data voltage and configured to control a period of a second driving current applied to a second light emitting element, a second pulse amplitude modulator configured to apply the second driving current to the second light emitting element in response to a second pulse amplitude data voltage different from the second pulse width data voltage and a second initializer configured to initialize the second gate output signal in response to the second initialization signal; and a light emitting element initializer configured to initialize the first light emitting element and the second light emitting element in response to the second initialization signal.

20. The display apparatus of claim 19, wherein the pixel further comprises a third sub-pixel including a third pulse width modulator configured to output a third gate output signal for the pulse width modulation in response to a third pulse width data voltage different from the first pulse width data voltage and the second pulse width data voltage and configured to control a period of a third driving current applied to a third light emitting element, a third pulse amplitude modulator configured to apply the third driving current to the third light emitting element in response to a third pulse amplitude data voltage different from the third pulse width data voltage and a third initializer configured to initialize the third gate output signal in response to the second initialization signal, and wherein the light emitting element initializer is configured to initialize the first light emitting element, the second light emitting element and the third light emitting element.

* * * * *